United States Patent [19]

Lassen

[11] Patent Number: 4,602,318
[45] Date of Patent: Jul. 22, 1986

[54] SUBSTRATES TO INTERCONNECT ELECTRONIC COMPONENTS

[75] Inventor: Charles L. Lassen, Cold Spring Harbor, N.Y.

[73] Assignee: Kollmorgen Technologies Corporation, Dallas, Tex.

[21] Appl. No.: 634,091

[22] Filed: Jul. 25, 1984

Related U.S. Application Data

[63] Continuation-in-part of Ser. No. 254,132, Apr. 14, 1981, Pat. No. 4,500,389.

[51] Int. Cl.⁴ .............................................. H05K 1/18
[52] U.S. Cl. .................................. 361/414; 174/68.5; 361/401; 361/406
[58] Field of Search ............... 361/400, 401, 404, 406, 361/414; 174/68.5

[56] References Cited

U.S. PATENT DOCUMENTS

| | | | |
|---|---|---|---|
| 3,646,246 | 2/1972 | Olney | 174/68.5 |
| 3,646,572 | 2/1972 | Burr | 174/68.5 |
| 3,674,602 | 7/1972 | Keogh et al. | 156/433 |
| 3,701,838 | 10/1972 | Olney | 174/68.5 |
| 4,000,558 | 1/1977 | Cahill | 174/68.5 X |
| 4,065,850 | 1/1978 | Burr et al. | 174/68.5 X |
| 4,276,775 | 7/1981 | Provasnik | 174/DIG. 8 |

FOREIGN PATENT DOCUMENTS 2097998 11/1982 United Kingdom ................ 361/400

OTHER PUBLICATIONS

O. R. Abolafia, Method of Connecting Layers of Circuitry Separated by a Dielectric, IBM Tech. Disc. Bull., vol. 22, #10, Mar. 1980, pp. 4471 & 4472.

Primary Examiner—R. R. Kucia
Assistant Examiner—T. Basma
Attorney, Agent, or Firm—Morgan, Finnegan, Pine, Foley & Lee

[57] ABSTRACT

Substrates for interconnecting components in which a filament is applied and affixed to a base in a pre-determined pattern, the base surface and applied filaments are coated with a coating and the coating is hardened to form a substantially flat surface over the base and filaments. The coated base is then positioned on a table movable along "x" and "y" axes and the coated base is positioned under a high energy beam at pre-programmed points on the applied filament pattern and access openings are formed in the coating on the base at such points to expose the filament at each such point so that the exposed filament can be interfaced with the exposed surface of the coated base and articles for mounting and interconnecting components formed thereby.

22 Claims, 17 Drawing Figures

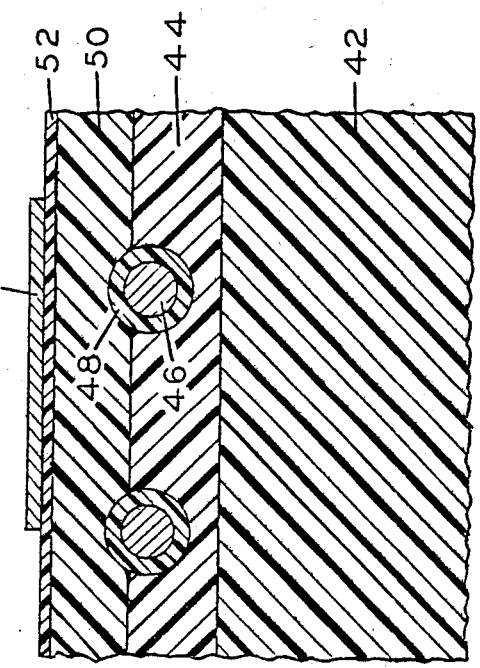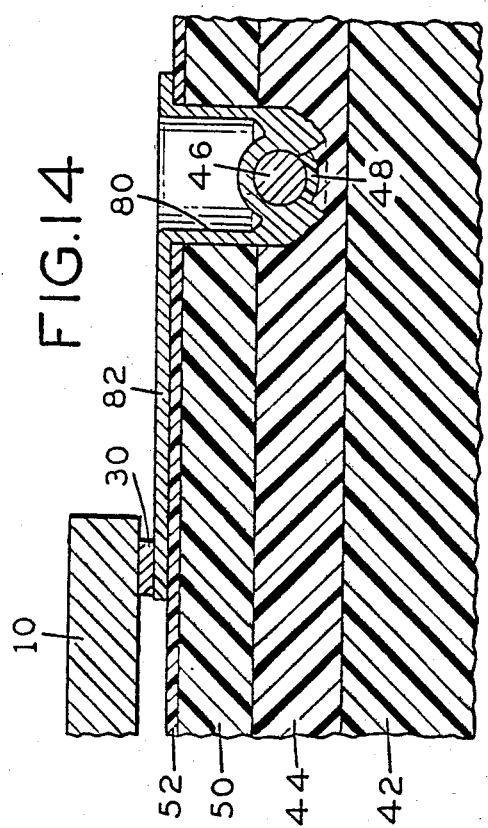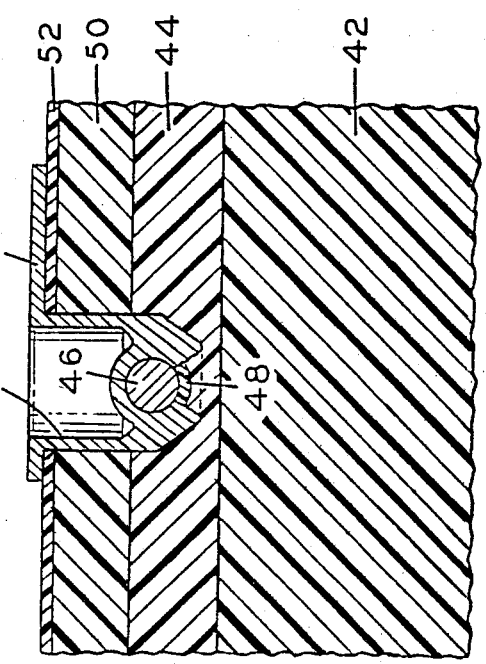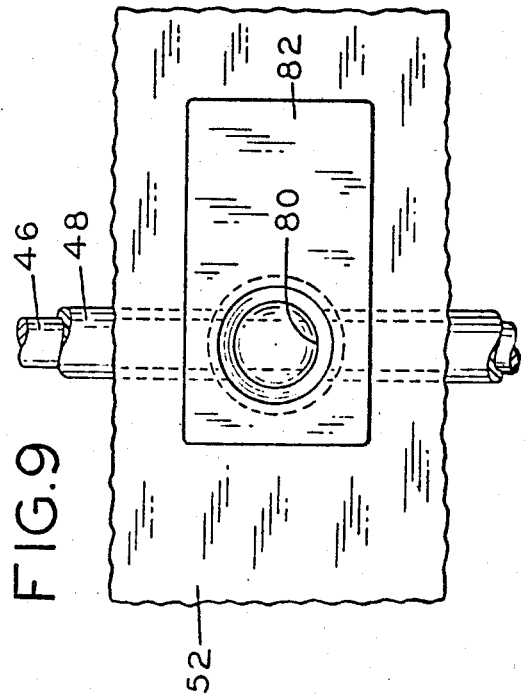

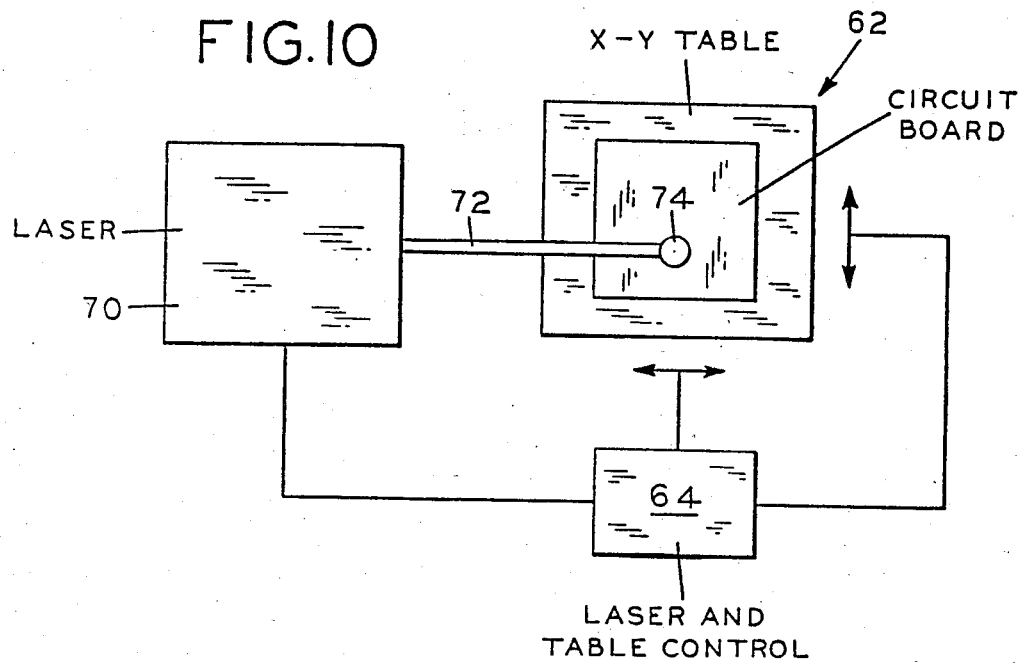
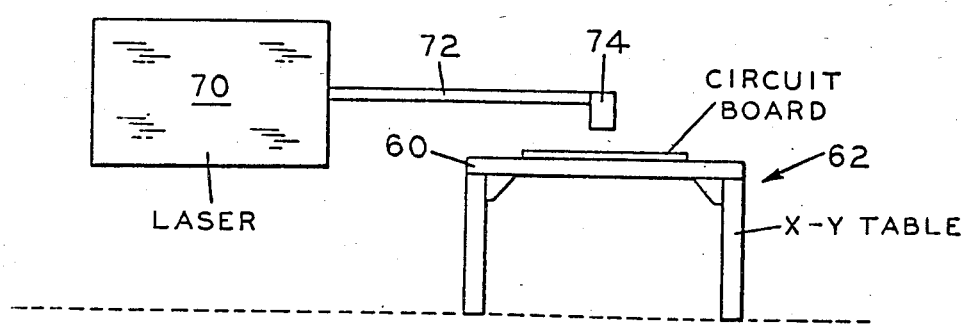

SUBSTRATES TO INTERCONNECT ELECTRONIC COMPONENTS

This is continuation-in-part of Ser. No. 254,132 filed 4/14/81 now U.S. Pat. No. 4,500,389.

This invention relates to substrates which include filamentary members and which support and interconnect components, a method for making such substrates, apparatus for carrying out the method and to the substrates produced thereby.

U.S. Pat. Nos. 3,674,602 and 3,674,914 both dated July 4, 1972 and U.S. application Ser. No. 9,082, filed Feb. 2, 1979, disclose and describe circuit boards employing filamentary members of wire, and methods and apparatus for making such boards. In such disclosures and descriptions, a wire is scribed onto the energy actuatable surface of an insulated base or board. The wire is scribed onto the surface in a predetermined pattern with a head. The head is energized, activates the surface as the wire is brought into contact therewith and bonds the wire to the board of base surface. The movement of the board, head and wire and energizing of the head are controlled in such fashion that the wire is scribed and fixed to the board in a precise pattern. Holes are drilled through the insulated board at points intersecting wire locations, thereby cutting the wires and exposing surfaces for metallization. The cut wire and drilled hole are metallized to form a terminal hole in the board electrically interconnected by the wire. These electrically interconnected terminal holes may then receive component leads which may be attached and connected to the board, such as, by soldering. A precise, electronic package is thus formed.

The replacement of hand wiring by such electronic packaging using wire scribed and printed circuit boards has reduced the size and weight of electronic equipment. Further reductions have been achieved through the development and general availability of integrated circuits. In such integrated circuits, a plurality of components performing different electronic functions are formed on a semiconductor surface which is incorporated into a microelectronic package. Such packages, commonly called dual-in-line packages, embody leads through which electrical contact may be made with the integrated circuit and which also serve to mount and connect the package to the holes in the wire scribed or printed circuit board. The leads of such dual-in-line packages are commonly spaced 100 mils apart on two parallel rows extending from the plastic or ceramic body of the package. The rows may be 300 or more mils apart and the packages may often be interconnected on low density wire scribed or printed circuit boards with conductors spaced on a 50 mil grid pattern.

While the dual-in-line package with leads on 100 mil centers and boards having 50 mil grid patterns have found extensive use, the desire to reduce the size and weight of electronic equipment and to increase the number of functions per unit volume has assumed increasing importance. Foremost in this drive for more electronic functions in less space are the designers and makers of integrated circuits. One of the results of increasing the number of functions on the integrated circuit is to increase the number of leads per microelectronic package. In complex integrated circuits with many leads, the geometry of the dual-in-line package, with its two rows of leads on 100 mil centers, makes the package excessively large in relation to the size of the integrated circuit. It also degrades the electrical performance of the circuit and makes insertion and removal from the printed circuit board difficult.

New, more compact, microelectronic packages have been developed to accommodate these complex integrated circuits. One such family of packages, commonly called chip carriers, may be surface mounted rather than being connected by leads passing through the board. These packages are square and have terminals on all four edges rather than on two sides as in the dual-in-line packages. The terminals are spaced on centers of 50 mils, 40 mils or less, thus substantially reducing the area of the package as compared to the dual-in-line package. This substantially increases the number of terminals per unit area.

The reduction in package area made possible by the chip carrier, substantially increases the number of microelectronic packages which may be mounted and electrically connected by a circuit board or interconnection substrate of given area.

However, such increase in number of packages or component package density and closer terminal spacing increases the terminal density requirement on the board or substrate and the heat density of the system. This increased terminal density generates and requires higher conductor density. Contact pads, rather than through holes, are employed on the surface of the substrate to provide higher conductor density. Electrical contact between such surface pads and the substrate conductors can be made in dimensions which approach that of the conductor itself.

The instant invention is particularly adapted to meeting the high density terminal and high density conductor requirements of chip carriers and unpackaged integrated circuit chips. At the same time, the instant invention allows substrate cores to be employed which possess particular properties such as good heat dissipation, low cost or the capability to match the coefficient of thermal expansion with the chip carrier or integrated circuit materials. Solder joint failure induced by temperature stress is avoided.

In the instant invention filaments are applied or scribed onto a carrier. The filaments or the carrier might have an energizable adhesive surface for bonding the filaments to the carrier. The filaments are applied or scribed to the carrier in a predetermined pattern with apparatus such as that shown and described in the aforementioned '602 or '914 patents or '082 patent application, the disclosures of which are incorporated herein by reference. The filaments may be optical fibers or preinsulated wires, such as copper wire of about 2 to 4 mil diameter which has been found to be particularly adapted for use in the instant invention. Thus, the filaments contain at least one conductive portion i.e., a portion which can act as a conductor, e.g., an electrical conductor, an optical conductor or the like. The conductive portion of the filaments may or may not have a dielectric coating.

The filaments are bonded to the carrier in a high density horizontal and vertical grid with grid center lines spaced about 12.5 mils apart. A layer of material is then applied, preferably in the form of liquid, over the filaments previously bonded to the carrier in a manner so as not to move or disturb the position of the filaments previously applied relative to each other or the carrier. The liquid forms a smooth, planar surface over the carrier and the filaments. Movement of the filaments might adversely affect subsequent processing and the utility of the article, and, thus is avoided. The coating, or encapsulation promotes positional stability of the wires with respect to each other and with respect to a datum on the carrier. The liquid material applied should be capable of being hardened at room temperature or at low temperature; for example, below 100° C. so as to avoid temperature excursions which might also adversely disturb the position of the filaments. Preferably the material is hardened at room temperature. This may be achieved by room temperature curing agents or by ultra violet radiation curing.

The surface of the applied liquid layer may be brought into temporary close contact with and the applied liquid leveled by the surface of a material which will not adhere to the surface of the liquid layer and the hardened surface formed thereby. Such temporary close contact surface, such as shown and described in U.S. Pat. No. 3,607,380 dated Sept. 21, 1971, levels the liquid layer surface without disturbing the filaments therein. A substantially planar surface, with the filaments embedded therein, is thus formed. Leveling might also be accomplished with a doctor blade, roller or squeegee so long as the filaments are not moved or disturbed.

Where the filamentary member is a wire, the hardened, planar surface is preferably capable of adhesion promotion by chemical or mechanical means or by ion bombardment so as to form micropores or surface roughness to provide anchoring sites for the deposition of conductive material by electroless plating, vapor deposition or other appropriate methods, at a later stage of processing. This may be achieved by the inclusion of preferentially etchable materials such as rubber or polyethersulfone, in the surface of the hardened, planar coating. This may also be achieved using chemical means, such as the application of oxides or the like.

Additional level or levels of filament grids may be added.

The carrier to which the filaments have been affixed and the planar material applied and hardened is attached to a table movable in a controlled pattern along 'X' and 'Y' axes so as to locate preprogrammed points on the carrier under a high energy beam, such as a coherent laser. The beam is directed perpendicular to the table and to the carrier mounted thereon. Alternatively, the carrier may be fixed and the beam moved in 'X' and 'Y' axes. The location of the filaments in the hardened, planar material may be targeted optically so as to substantially eliminate location errors. The carrier is moved relative to the high energy beam so that the desired filament is in line with the beam at a predetermined point. The filament is then exposed by the beam at such point. Preferably, if the filament is metallic, a high energy beam, such as a $CO_2$ laser is used. When the beam is aligned with the desired predetermined point on the filament, the beam is pulsed or modulated to direct energy at the filament so as to vaporize and remove the hardened material and the filament insulation, leaving a precisely formed cavity with the filament substantially exposed. This is achieved with a $CO_2$ laser using the contrast between the reflective power of the metallic filament to $CO_2$ laser light and the absorbative power of the largely organic insulation and hardened surface coating material applied hardened over the filaments on the carrier. A cavity is understood herein to mean an opening in the hardened, planar material in which a filament or other functional element is exposed. A cavity is to be distinguished from a "hole" or "terminal hole", which severs the filament and/or the carrier to which the filament has been affixed. An interconnection substrate of this invention has at least one termination point for which a cavity is used.

In addition to a high energy beam, such as a $CO_2$ laser, the hardened material and wire insulation might be removed with other suitable lasers or controlled depth mechanical drills, by a modulated stream of abrasive particles, a water jet or stream of chemicals or solvents. In any event, cavities of precise size, not substantially larger than the filament and no larger than that required to interface the filament with the surface should be formed. The hardened, planar material and insulation is removed leaving the filament substantially intact and exposed, so that its conductive characteristics are not impaired. With a wire filament size of 2 to 4 mils, the diameter of the cavity would be between 6 and 12 mils.

This method of creating termination points provides a means of overcoming stress-induced failures of interconnections when holes are drilled through the filaments as it produces a means for surrounding the filament with plating material and for allowing the filament to move with the surrounding insulation when subjected to temperature excursions.

When all the predetermined filament points have been exposed and filament access cavities have been formed, the circuit might be finished in conventional manner. Where the filaments are metal wires, this is accomplished by adhesion promotion of the surface followed by sensitizing the cavities, exposed filaments and surface such as with a catalyst and electrolessly depositing metal, for example, copper. This may be carried out selectively to form surface features formed by subsequent masking and etching. Additional thickness of metal may be built up by electroplating and surface features formed by conventional semi-additive means.

During the plating operation metal is deposited on the walls of the cavities and on the surface and makes intimate contact with the exposed surface of the filament to interface the filament with the external surface. Metal may also be deposited in cavities which do not interface with filaments, but interface with other conductive features, such as pads, or power and ground planes, at other levels in the circuit. Alternatively, means other than plating may be used to interface the filament or other conductive feature to the external surface. Such means might include sputtering of metal, metal spraying, conductive polymeric pastes, solder pastes and conventional solder. In the case where the filament is not a metal wire, means appropriate and compatible with the filament conductor may be used to interface the filament to the external surface. For example, an optoelectronic means might be employed to interface optical filaments with electronic components.

In the instant invention, the high density interconnection circuit may be formed and processed on a carrier which will form an integral part of the article or may be formed, processed and then removed from the carrier. Where the carrier is to remain as an integral part of the article processed and formed, the carrier should, of course, be of a material suitable for the article and dimensionally stable for the process.

The material which forms the core of the substrate base used in the present invention may be made from materials having good heat dissipation, which are dimensionally stable (i.e. do not exhibit net change after experiencing temperature excursions) and which, preferably, have coefficients of thermal expansion in the X,Y-plane which match the coefficient of thermal expansion of the chip carrier or integrated circuit materials to be mounted on the substrate. If leaded components are used, however, the coefficients of thermal expansion of the core and the components need not match. Preferably, the substrate core may be made of an alloy of nickel and iron, preferably between 55–65%, iron and 35–45% nickel. More preferably, an alloy of about 57–60% iron and 40–43% nickel should be used. The alloy sheet is preferably clad with a thin layer of conductive metal such as copper to provide thermal and electrical conductivity. The core may also be a thin laminate composed of a thin fiberglass-reinforced epoxy resin sheet bonded on both sides with composite metal sheets. The composite sheets themselves should have thin metal alloy cores of about 60–65% iron and 35–40% nickel which are clad with very thin copper sheets. Also preferable for use as core materials are copper/molybdenum alloys, polyimides and epoxy resins which may be reinforced with glass, quartz, kevlar ® or the like. Preferably, the coefficients of thermal expansion should be between 5 and $20 \times 10^{-6}$ in/in/°C. Some examples of possible core materials and their coefficients of thermal expansion in the X,Y-plane are shown in Table I.

TABLE I

TYPICAL THERMAL COEFFICIENTS OF EXPANSION (in X- and Y-Axes) FOR SEVERAL COMMONLY USED SUBSTRATE MATERIALS

| SUBSTRATE TYPE | TCE |
| --- | --- |
| Alloy 42 (58% iron, 42% nickel) | $5.5 \times 10^{-6}$ in/in/°C. |
| Cu-clad Invar (64% iron, 36% nickel) | $5-8 \times 10^{-6}$ in/in/°C. |
| Cu/Mo Alloy | $6.0 \times 10^{-6}$ in/in/°C. |
| Polyimide/Quartz | $7-9 \times 10^{-6}$ in/in/°C. |
| Polyimide/Glass | $12 \times 10^{-6}$ in/in/°C. |
| Polyimide/Kevlar$^R$ | $5-7 \times 10^{-6}$ in/in/°C. |
| Epoxy/Kevlar$^R$ | $5-7 \times 10^{-6}$ in/in/°C. |
| Epoxy/Glass | $12-16 \times 10^{-6}$ in/in/°C. |

Where, for example, the article to be formed is to include metal filaments and a metal base, a dielectric film or coating would first be applied to the metal base. Such film or coating may include isolated metal pads at the points where cavities are to be formed to deflect the high energy beam and avoid short circuiting to the metal base.

Where the formed circuit after processing is to be removed from the carrier and the carrier reused, the circuit is formed, built up and processed on the carrier and then peeled off and removed. The formed circuit, peeled from the carrier might then be laminated to a base or formed circuits might be built up or laminated one over the other to form a multi-level circuit.

Where, for example, metal filaments are to be employed, and the article, formed and processsed, is to be removed from the carrier, the carrier may be of stainless steel plated with lightly adherent copper. Other lightly adherent combinations of carrier and plating might be employed. The article is built up and processed on the carrier and, with the plating, is peeled from the carrier. After removal from the carrier the plating on the article may be used in the formation of conductive features by conventional processes.

The high conductor density which is achievable with the filament grid geometry of about $12\frac{1}{2}$ mils and more particularly with the small diameter of the filament access cavities of the instant invention, enables complex interconnect patterns to be executed with a minimum of levels. The circuit may therefore be manufactured with a thickness of about 10 to 20 mils.

The thinness of the circuit thus formed or laminated to a base allows the components to be positioned in close proximity to that base. This allows properties of the base such as coefficient of thermal expansion and heat dissipation to be imparted to the components more readily than in the instance of thicker, lower density, multiple level circuits. The problems of heat and heat dissipation are alleviated.

The present invention may also be used to make particular interconnection circuit boards having the ability to accommodate compact microelectronic packages. The interconnection circuit boards made according to the present invention may take the form of certain preferred embodiments.

One preferred process of making the interconnection circuit boards according to the present invention is to apply thin copper foil to each side of a substrate core using a suitable dielectric bonding material. Circuit patterns should be formed on one or both of the copper foil surfaces according to methods known to those possessing skill in the art. The substrate base should be treated so as to promote adhesion. The surface of the substrate base should then be encapsulated with a resin so as to obtain a flat, smooth, planar surface. The coating should be covered with an adhesive and the surface scribed with filaments, such as wire conductors. The wire-scribed circuit pattern should then be encapsulated with resin to form a smooth, flat, planar surface and to provide a means for maintaining the positional relationship of the filaments. It should then be further coated with adhesive. This substrate should be mounted on an X-, Y- positioning table and cavities formed at predetermined locations. The cavities should be cleaned and treated to promote subsequent metal plating. The substrate should then be plated with conductive material and circuit patterns should be formed in the conductive material according to methods known to those of ordinary skill in the art.

In another preferred embodiment, a sequence of layers may be produced which provide circuitry for two or more desired function on one board. In this embodiment, conductive material should first be laminated to a substrate core using a dielectric bonding material. A circuit pattern should be formed on the resulting substrate base. The surfaces should be treated to promote adhesion. Thin sheets of conductive material should be laminated to the base such that the conductive material is isolated from the base and is on the exterior surfaces. Additional circuit patterns can then be formed on the conductive material. The substrate base should then be placed on an X-, Y- positioning table for cavity formation between the two conductive layers in predetermined areas between the two conductor layers. The substrate base should then be plated to deposit conductive metal in the cavities. If desired, additional circuit layers may then be formed over these layers in accordance with the process of this invention. The surface of the substrate base should then be encapsulated with a resin so as to obtain a flat, smooth, planar surface. The coating should be covered with an adhesive and the surface scribed with filaments, such as wire conductors. The wire-scribed circuit pattern should then be encapsulated with resin to form a smooth, flat, planar surface and to provide a means for maintaining the positional relationship of the filaments. It should then be further coated with adhesive. This substrate should be mounted on an X-, Y- positioning table and cavities formed at predetermined locations. The cavities should be cleaned and treated to promote subsequent metal plating. The substrate should then be plated with conductive material and circuit patterns should be formed in the conductive material according to methods known to those of ordinary skill in the art. This embodiment provides for at least two circuit levels, which can be used for power and ground distribution, logical functions, or the like. Obviously, more than two or three circuit levels can be provided for and a plurality of circuit levels built on the substrate base.

Using the encapsulating method of the present invention in order to maintain the position of the wires and thus enable the conductors to be scribed in high density, another embodiment may be produced. The substrate base may be wired on both sides and povided with plated through-holes in order to provide side-to-side communications between the sides of the circuit board. The conductors should be positionally stabilized with encapsulation according to the present invention to enable very close clearances. In this embodiment, one or more cavities may be made in addition to the through-holes.

The present invention will be more fully described and will be better understood from the following further description of preferred embodiments of the invention taken with the appended drawings in which:

FIG. 8 is a sectional view similar to FIGS. 4 and 6 but showing the conductor and conductor pad after plating;

FIG. 9 is a top plan view of the section of FIG. 8;

FIG. 10 is a schematic plan view of an apparatus for carrying out part of the process and for producing the cavities of the instant invention;

FIG. 11 is a side view, in elevation, of the schematic apparatus of FIG. 10;

FIG. 13 is a sectional view of the interconnection substrate of one embodiment of the instant invention showing the circuit with a base and surface conductor;

FIG. 14 is a view similar to FIG. 13 but showing interconnection between the conductor or wire and a chip and without the chip carrier.

Figure 1:
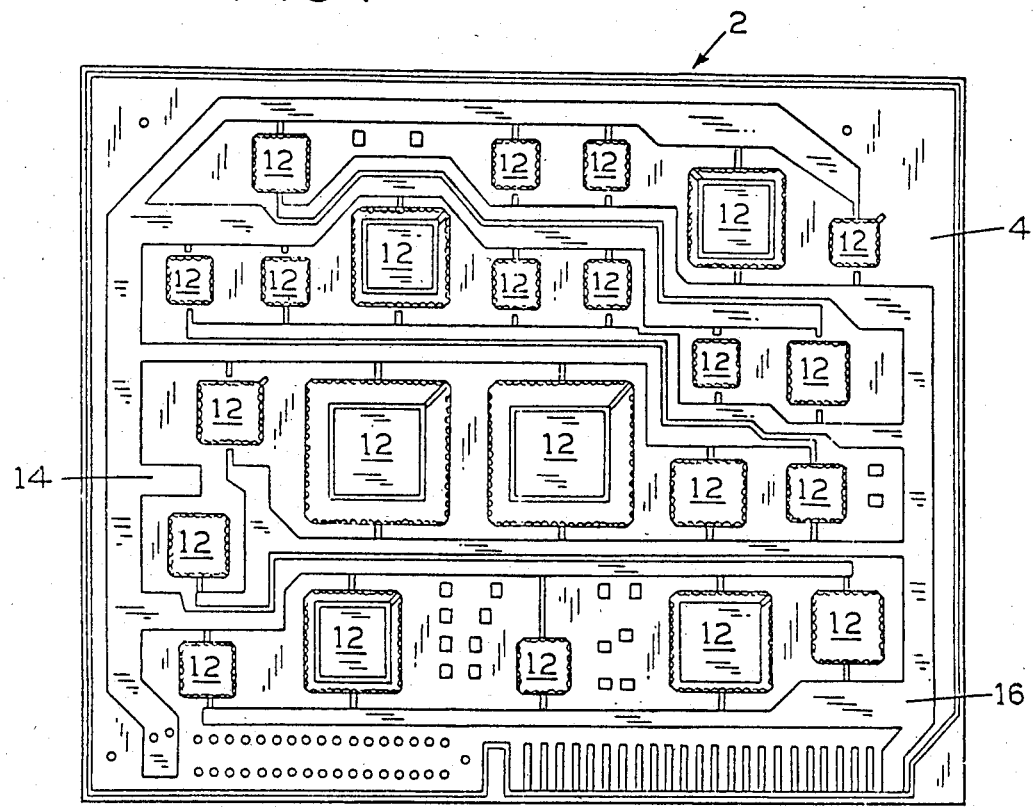
FIG. 1 is a top plan view of an interconnection substrate of the present invention.

Referring to the drawings, particularly FIG. 1, the circuit generally designated 2, includes the interconnection substrate 4 having mounted thereon chip carrier, chip and cover assemblies 12. Chip carriers 12 are connected to surface pads and may be connected to power and ground bus bars 14, 16 formed on the surface of substrate 4.

Figure 2:
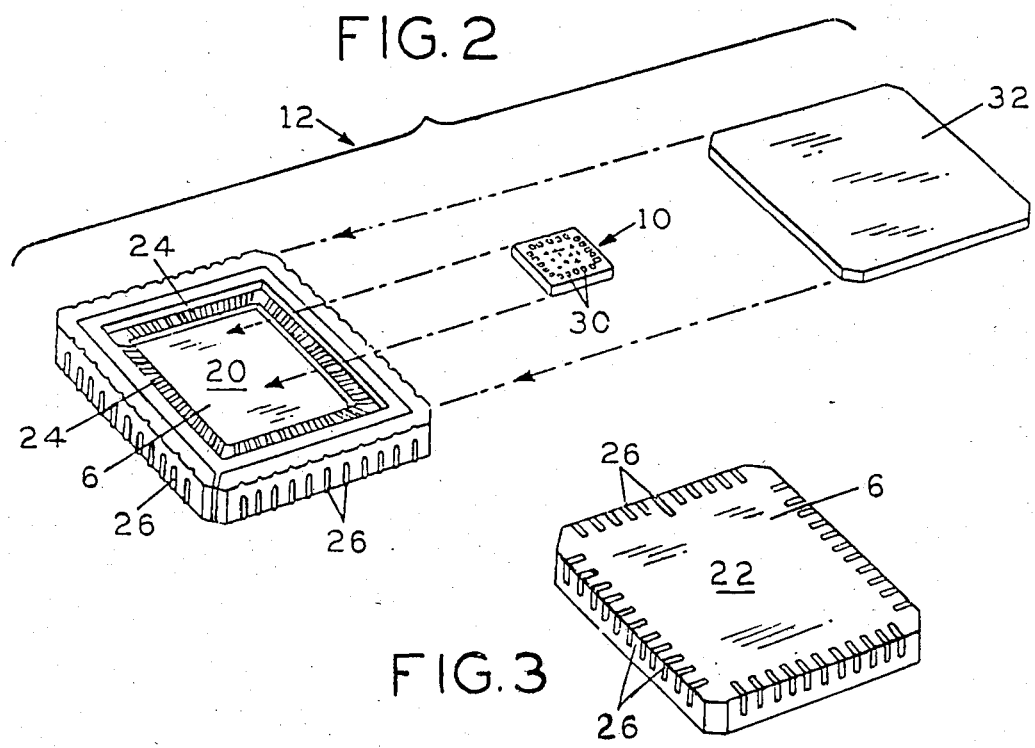
FIG. 2 is an exploded view, in perspective of a chip carrier, chip, and cover, to which the invention is particularly adapted.
Figure 3:
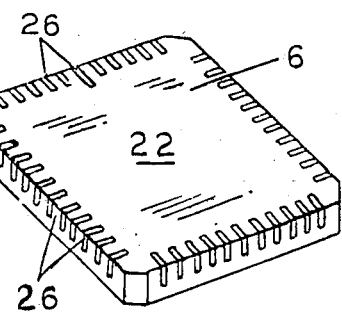
FIG. 3 is a perspective view of the chip carrier of FIG. 2 when viewed from the bottom.

Chip carriers 12 vary in size, depending upon the complexity and size of the chip carried therein. As best shown in FIG. 2, chip carrier 12 is made up of a body 6, having a recessed center top portion 20 and a flat bottom portion 22, FIG. 3. For purposes more apparent later herein, recessed center top portion 20 has a plurality of contacts 24 spaced therearound. Bottom 22 and the sides of body 6 are provided with a plurality of contacts 26 spaced around the carrier sides and extending onto bottom surface 22, FIG. 3. Chip 10, FIG. 2, has a plurality of contacts 30 extending around the top edge of the chip.

Chip 10 is assembled in recess 20 of body 6 with contact 30 of chip 10 connected to contacts 24 in recess 20 of body 6. With chip 10 in recess 20 and contacts 30 and 24 connected, cover 32, FIG. 2, is placed over recess 20, covering the recess and the chip 10 therein. As will be later described, contacts 26 of body 6 to be connected to the circuit 2 are mounted on and soldered to contact pads on the substrate after the circuit is fabricated and the desired contact pads are formed thereon. As will also be described later herein, contacts 30 in chip 10 may be connected, by soldering, wire bonding or other appropriate means, directly to the contact pads on the substrate, once such contact pads are formed, and carrier body 6 with cover 32 are not used.

Referring next to FIGS. 4–9, in this illustrated embodiment, base 42, which may be plastic, glass fiber reinforced plastic, or ceramic, as indicated in the Figures, is coated with an adhesive 44 activatable by ultrasonic energy. In another preferred embodiment, not depicted, base 42 may alternatively be coated metal. Metal wire 46 coated with an insulating coating 48 is scribed onto and embedded in adhesive 44 in accordance with the teachings and disclosures of the aforementioned '602 and '914 patents and the '082 application the disclosures of which, as already noted, are incorporated herein by reference. The substrate, with the wire scribed thereon in the preprogrammed pattern, may be heated and baked to further cure the adhesive in which the scribed wire is embedded and to remove and drive off volatiles from the adhesive. A liquid material 50 is then cast over the scribed wires. The exposed surface of the liquid 50 is brought into contact with the surface of a film, such as a polyester, which will not adhere to the coating, the coating is cured or hardened at a temperature below 100° C. and the non-adherent film is removed. Such a procedure is disclosed and described in the aforementioned '380 U.S. patent, the disclosure of which is incorporated herein by reference. The exposed surface of the liquid 50 might also be spread and leveled with a knife, doctor blade or roller or might be flowed, ponded or puddled onto the wire scribed board before the material 50 is cured or hardened. In any event, a smooth, flat, planar surface is thus provided on the substrate. The dried and cured coating forms layer 50 over the wire scribed board. A thin adhesive coating 52, such as epoxy rubber, may be applied over layer 50 and dried or cured so as to form a coating over the board for adhering the metal subsequently applied by printing, plating or the like.

Figure 4:
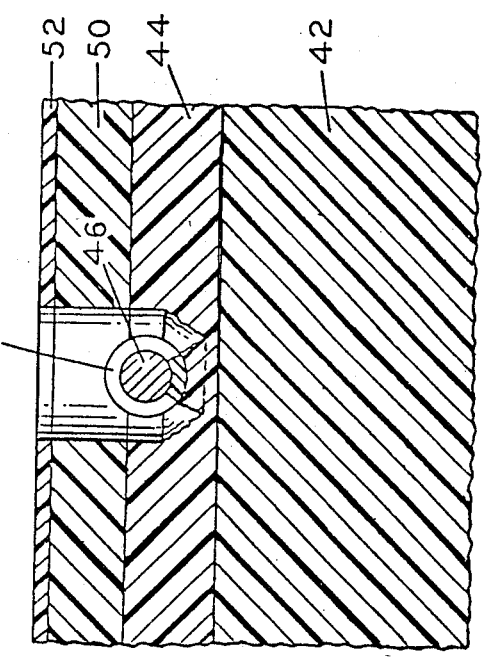
FIG. 4 is a sectional view through a section of an interconnection substrate showing the preinsulated conductor before high energy ablation of the coating and insulation.

Referring next to FIGS. 10 and 11, the wire scribed and adhesive coated substrate of FIG. 4 is mounted on and registered with table 60 of 'X' - 'Y' table machine, generally designated 62, numerically controlled, such as with a floppy disc computer controller 64, and preprogrammed to move table 60 and the substrate attached thereto through a preset sequence. A high energy source, such as laser 70, capable of being focused and applied as a vertical beam to the substrate on the table is projected through tube 72 and is applied vertically such as through a mirror and mirror head 74. An Everlase 150 Watt $CO_2$ laser manufactured by Coherent Inc., has been found to be particularly adaptable as a high energy laser source of use in the instant invention. Computer drive 64 not only controls the movement and stopping of 'X' - 'Y' table 62 but also controls the pulsing of laser 70. Thus, as table 60 and the scribed substrate mounted thereon is moved from point-to-point and then stopped by control 64, at each stop laser 70 is pulsed.

Figure 6:
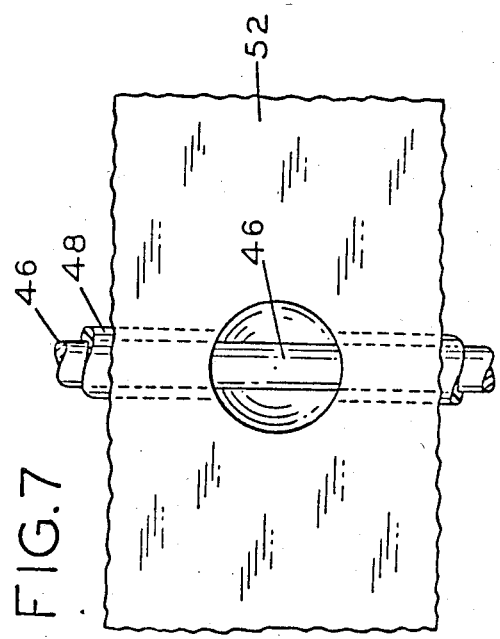
FIG. 6 is a sectional view similar to FIG. 4 but showing the exposed conductor after formation of the interfacing cavity.
Figure 5:
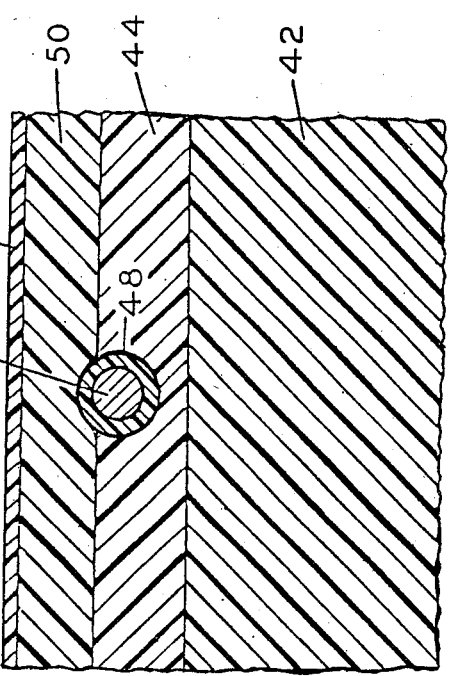
FIG. 5 is a top plan view of the section of FIG. 4.
Figure 7:
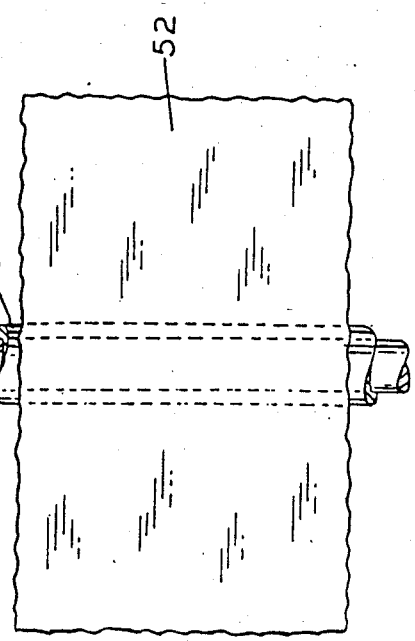
FIG. 7 is a top plan view of the section of FIG. 6.

As best shown in FIGS. 6 and 7, with the wire scribed and rubber epoxy coated substrate of FIG. 4 mounted on table 60, table 60 and computer drive 64 are preprogrammed so as to align conductor 46 with the beam from mirror head 74. When the conductor 46 is so aligned, table 60 and the substrate mounted thereon is stopped and the high energy source is pulsed. The high energy source, in the described embodiment a laser, may be pulsed once during each stop or a series of pulses might be applied. The power of the energy source is adjusted so as to apply the energy to the substrate at the desired absorption level. In any event, the rubber epoxy coating and the coating over the conductor are heated, vaporized and flashed off. Insulation 48 is exposed to the beam and with the coating is vaporized and flashed off. The metal in the conductor or wire 46, which in the preferred embodiment is copper, reflects the energy beam and remains intact. Thus, as best shown in FIGS. 6 and 7, a substantially cylindrical cavity is formed from the surface into the substrate leaving the conductor or wire in the opening partially bare and exposed.

After the preprogrammed pattern of cavities or openings in the board surface has been completed, the walls of the cavities, rubber epoxy coated surface and exposed wire are cleaned and metal plated. This may be accomplished by electroless plating or with a combination of electroless and electroplating, the cavity and outer epoxy rubber surface being first sensitized with a catalyst applid after high energy formation of the cavity or incorporated during initial casting and coating application. The catalyst sensitized surface is first electrolessly plated to form a thin coating of metal on the surface along the cavity walls and around the exposed wire and then the electroless metal deposition might be built up in thickness by electroplating or further electroless plating.

Figure 12:
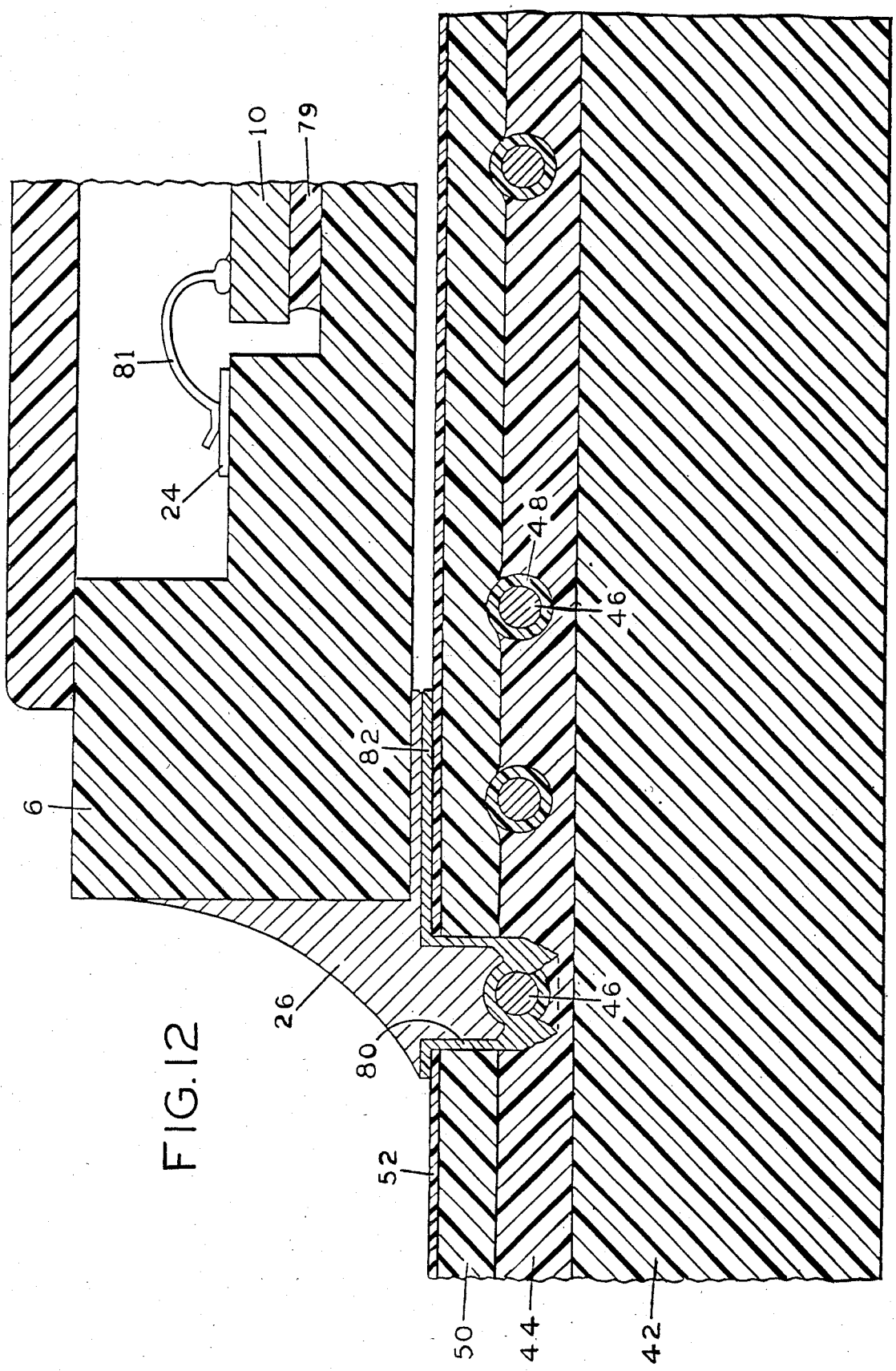
FIG. 12 is a sectional view of the interconnection substrate of the instant invention showing the interconnection between the conductor or wire, a chip carrier and chip.

After the substrate and cavities have been plated, conductor pads, and ground and power planes or conductors might be formed on the surface by masking and etching in any of the manners conventionally followed in preparing circuit board surfaces. These planes may also be formed prior to wire-scribing such that they are on the interior of the carrier board. Thus, as best shown in FIGS. 8 and 9, the walls of the conductor cavities are coated at 80 with metal, such as copper, and conductor pads 82 and planes 84, FIG. 13, are formed on the board surface. As best shown in FIG. 12, chip carrier 12 is electrically connected at carrier contact 26 by solder joint with conductor pad 82. As best shown in FIG. 12, chip 10 might be mounted and cemented by cement 79 and directly connected to conductor pad 82 by solder joint 81, wire bonding or other appropriate means to chip conductor 30 in which case carrier 12 would not be used.

Figure 16:
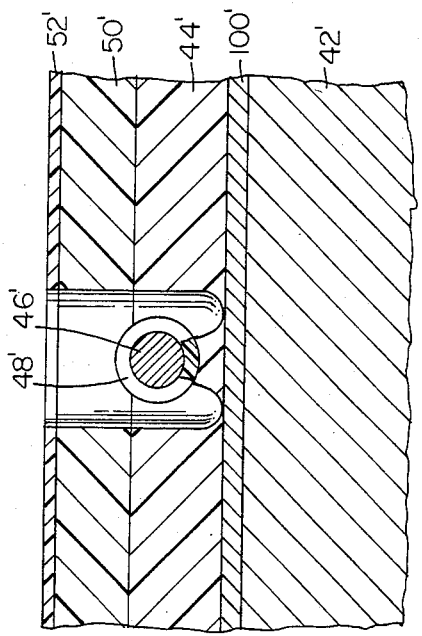
FIG. 16 is a view similar to FIG. 15 but showing the exposed conductor after formation of the cavity.
Figure 15:
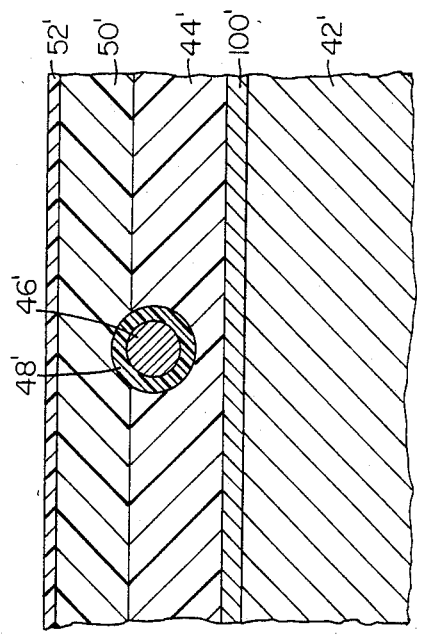
FIG. 15 is a view similar to FIG. 14 but showing the embodiment in which the circuit, when completed, is to be removed from the metal base.
Figure 17:
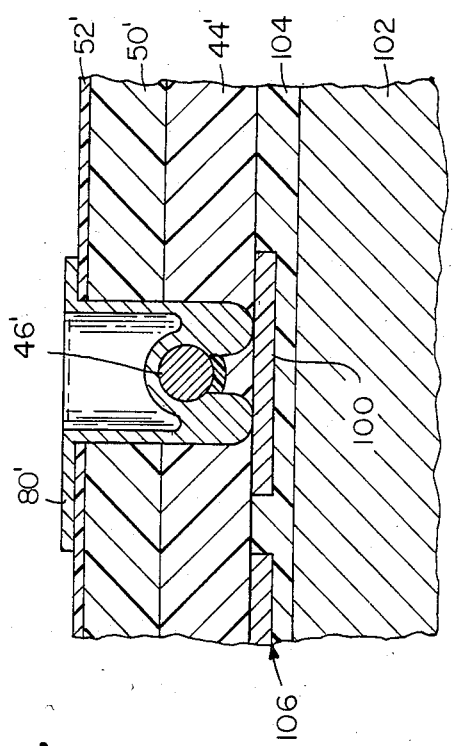
FIG. 17 is a view similar to FIGS. 15 and 16 but showing the conductor and conductor pad after plating, with the processing metal base removed and the circuit bonded to a permanent base.

The embodiment of the invention illustrated in FIGS. 15, 16, and 17, is similar to the embodiment already described and is formed in substantially the same manner. Where the two embodiments differ is that, while the embodiment already described produces a substrate with an integral base used for stability during processing and as a part of the final product, the embodiment of FIGS. 15, 16, and 17 utilizes a base for processing only. Thus, metal base 42' is copper plated with plating 100. Adhesive 44' is adhered to copper plating 100, wires 48' are applied or scribed and coatings 50', 52' are applied in the manner as in the aforedescribed embodiment.

When the cavities are subsequently filled with metal, as best shown in FIG. 17, metal to metal contact is not only provided between the hole filling metal 80' and exposed wire 48' but may also be provided with copper plating 100. Thus, when metal base 42, is removed, as shown in FIG. 17, the exposed surface of plating 100 may be masked and etched to form isolated conductor pads and power or ground distribution busses. The circuit is mounted on base 102, FIG. 17, which may be of metal as depicted or any other support material coated with an adhesive 104 which, in the case of a metal base, should also be dielectric.

In the preferred embodiments of the invention, the dielectric base is mounted on and affixed to a rigid stable base while the wire is scribed, the liquid coating is applied, leveled, flattened and cured in accordance with the teachings of the '380 U.S. patent, the cavities in the circuit to expose the wires or conductors are formed by high energy beams and the holes are electrolessly plated or electroplated. In the instance of the embodiment of FIGS. 4-9, the base is permanently affixed and remains a part of the finished circuit. In the embodiment of FIGS. 15-17, the metal base upon which the circuit is mounted and affixed for processing is removed, the processed circuit, with the high energy formed cavities filled with electroless or electroplated metal is bonded to a base, which may be a dielectrically coated metal base or base of dielectric material or some other dielectrically coated material. A plurality of processed circuits, each affixed to and mounted on a metal base for processing and subsequently removed therefrom, might be laminated and connected, one on the other, and before or after laminating might be mounted and affixed to a dielectric base or a dielectric coated base.

In the preferred embodiments of the invention, the conductor ot wire extends through the high-energy-formed cavity at the time of plating. This provides better electrical contact and mechanical strength between the conductor and cavity plating metal than could be provided when attempting to drill through a 2 to 4 mil diameter wire with a 6-12 mil diameter drill.

In the practice of the instant invention, encapsulating coating 50, 50' may be cast, in situ, over the wire scribed circuit. Voids between the coating and the wire scribed circuit surface may be removed with a doctor blade or roller applied to the exposed surface of coating 50, 50'. Rather than casting coating 50, 50' in situ, the coating material may be a low temperature thermosetting or ultra-violet curing material, such as an epoxy, a polyamide or an acrylic, and may be cast on the surface between the surface and a pre-formed sheet and applied over the wire scribed circuit with a doctor blade, roller or platen to level the coating between the sheet and wire scribed circuit. In any event, encapsulating coating 50, 50' forms a planar surface over the irregular wire scribed circuit and is cured or hardened before cavities are formed in the circuit. Coating 50, 50' should be of a material or contain an additive so that the coating can be cured or hardened at low temperature or by low temperature radiation, such as ultraviolet radiation. A coating process such as disclosed and described in the aforementioned '380 U.S. patent, is satisfactory. Additional planar coatings may, of course, be added to the circuit or the desired characteristics of these coatings, such as adhesion may be incorporated in encapsulating coating 50, 50'.

Circuits produced in accordance with the instant invention, particularly the embodiment of FIGS. 15-17, may be laminated, one over the other. In carrying out such lamination, dielectric coating or adhesives should be used between the circuits to maintain circuit integrity.

In the practice of the instant invention cavity forming with a high energy beam, such as a laser, has been found to be particularly useful. However, as already noted, other means, such as a drill bit, abrasive, chemical or high speed jet might also be employed. Other high energy beams absorbable by the material being drilled, but not the condcutor or wire, and capable of volatilizing the material and insulation on the conductor or wire, may be employed.

The following examples serve to illustrate certain preferred embodiments of the present invention. The purpose is not, in any way, to limit the scope of the present invention.

EXAMPLE 1

A 0.018-inch thick metal alloy sheet core of 64% iron and 36% nickel was clad on both of its planar surfaces with copper metal sheets having a thickness of 0.006 inch. The copper surfaces were treated with black oxide solution to promote adhesion. The substrate base was laminated on each side with copper foil 0.0014 inches in thickness and a semi-cured fiberglass-reinforced epoxy resin sheet. The lamination took place at a pressure of 375 psi and 350° F. for a period of 25 minutes. The substrate base was then baked at a temperature of 350° F. for 1 hour in order to effect full curing of the epoxy resin.

The substrate base was then brushed in order to clean the surface. Circuit patterns were formed on one side of the substrate base by exposing a dry film photoresist to an ultraviolet light source and developing the pattern. The other side of the substrate base was encapsulated by photoresist material.

The substrate base was then exposed to a ferric chloride-water solution to remove exposed copper metal from the surface of the substrate base. The remaining photoresist was removed from the surface and the substrate base treated with black oxide solution to promote adhesion.

The patterned surface was then coated with an encapsulating resin according to the following procedure:

A pair of rigid rollers, mounted parallel to each other, were adjusted to provide a controlled encapsulation thickness. A filled, thermosetting epoxy resin which cures at room temperature was thoroughly mixed with an amount of curing agent sufficient to ensure complete polymerization of the system. This mixture was placed into a bell jar and the bell jar evacuated with a vacuum pump. The mixture was uniformly applied to the patterned surface of the substrate base. The substrate base was then placed in a vacuum chamber to remove any air in the mixture. After removal from the vacuum chamber, one edge of the substrate base was placed into the preset gap between the rigid rollers. One edge of a 0.004-inch thick release-treated polyester carrier sheet on which was coated a 0.0027-inch thick sheet of wiring adhesive was placed in contact with and parallel to the gap edge of the substrate base. The substrate base, carrier sheet and adhesive were then drawn through the gap in order to bond the adhesive to the resin surface such that the surface of the adhesive was substantially flat.

The encapsulating resin was allowed to cure at room temperature for a period of 8 hours. The substrate base was then baked for period of 30 minutes at a temperature of 150° F. After baking, the substrate base was placed onto a computer-controlled X-, Y- positioning table with the adhesive-coated surface exposed. An energized wiring head assembly was brought into close proximity with the adhesive surface and an insulated copper wire 0.0025 inch in diameter was placed between the head assembly and the adhesive surface. The table was moved to predetermined locations and the head assembly was directed to dispense the insulated wire and to bond it to the adhesive surface and thereby form a precise wire-scribed circuit pattern. The substrate base was then baked for a period of 90 minutes at a termperature of 200° F.

The wire scribed circuit pattern was then coated with an encapsulating resin coating and adhesive sheet to stabilize the position of the scribed wire and to form a flat, planar surface in accordance with the procedure described above. The adhesive sheet in this procedure was specifically-adapted for processing in semi-additive plating techniques. This adhesive sheet was 0.0012 inch thick. After being drawn through the rollers, the substrate base was allowed to cure at room temperature for 8 hours and then baked at 150° F. for 90 minutes.

The substrate base was then placed onto an X-, Y-positioning table with the adhesive surface exposed and the beam of a carbon dioxide laser was directed at the adhesive surface at predetermined locations. The laser beam vaporized and removed the materials surrounding the copper wire, and formed cavities which were between 0.010 and 0.012 inch in diameter.

The substrate base was then placed in an oven and baked for 30 minutes at a temperature of 250° F. The temperature of the oven was then increased to 350° F. and the substrate base was baked for an additional 90 minutes. The substrate base was cleaned by an ultrasonically-agitated cleaning solution and rinsed in order to removed any dirt or debris from the laser-generated cavities. The substrate base and cavities were further cleaned by immersion for forty minutes in a solution of potassium permanganate in water which was maintained at a pH of about 13.5. After this immersion, the substrate base was immersed for 3 minutes in a permanganate neutralization solution of stannous chloride and hydrochloric acid in water. This solution was maintained at room temperature. Immediately thereafter, the substrate base was immersed in a second neutralization solution having a reduced stannous chloride concentration for three minutes. The substrate base was rinsed in running water for 6 minutes.

A palladium/tin catalyst was applied to the substrate base to activate it. It was then immersed in an electroless copper plating solution of the type commonly used for the manufacture of printed circuits until a very thin layer of copper metal had been deposited on its surface. It was removed from the electroless copper plating solution and rinsed in running water for 60 seconds. The substrate base was then electroplated to increase the thickness of its surface copper deposit.

The substrate base was then brushed and coated with a dry film photoresist which was exposed and developed as described above to form a circuit pattern on the substrate base. It was then again electroplated in order to increase the thickness of the copper deposit in those areas which had been exposed by patterning the photoresist. The substrate base was rinsed in running water and immersed in a commercially available tin/lead electroplating solution. In order to deposit tin/lead on all exposed copper surfaces.

The photoresist was removed from the surfaces of the substrate base and then exposed to a copper etching solution which did not dissolve or remove the tin/lead plating, preserving the desired circuit pattern while all undesired copper metal was dissolved and removed.

The substrate base was rinsed in running water and then baked for 30 minutes at 150° F. The temperature was increased to 350° F. and the substrate base baked for an additional 120 minutes. The substrate base was then subjected to conventional fabrication operations such as cutting to size, and drilling mounting holes to produce a finished wire-scribed circuit board.

EXAMPLE 2

A 0.018-inch thick metal alloy sheet core of 64% iron and 36% nickel was clad on both of its planar surfaces with copper metal sheets having a thickness of 0.006 inch. The copper surfaces were treated with black oxide solution to promote adhesion. The substrate base was laminated on each side with copper foil 0.0014 inche in thickness and a semi-cured fiberglass-reinforced epoxy resin sheet. The lamination took place at a pressure of 375 psi and 350° F. for a period of 25 minutes. The substrate base was then baked at a temperature of 350° F. for 1 hour in order to effect full curing of the epoxy resin.

The substrate base was then brushed in order to clean the surface. Circuit patterns were formed on one side of the substrate base by exposing a dry film photoresist to an ultraviolet light source and developing the pattern. The other side of the substrate base was encapsulated by photoresist material.

The substrate base was then exposed to a ferric chloride-water solution to remove exposed copper metal from the surface of the substrate base. The remaining photoresist was removed from the surface and the substrate base treated with black oxide solution to promote adhesion.

After patterning, thin, single-sided copper-clad laminated sheets were applied to each side of the substrate base laminating semi-cured fiberglass reinforced epoxy sheets as the bonding medium as in Example 1. The substrate base was then baked in order to cure the epoxy resin fully.

Circuit patterns were formed on the substrate base as described above in Example 1, except they were in the form of circular areas which were between 0.008 and 0.010 inch in diameter. The copper metal was dissolved and removed from the circular areas, and the photoresist was removed as in Example 1.

The substrate base was then placed onto a computer-controlled X-, Y- positioning table with the circular areas exposed. The table was moved to predetermined locations in order to vaporize and remove the cured epoxy resin layer between the two copper layers in the circular areas using a carbon dioxide laser as in Example 1.

The substrate base was then cleaned and rinsed as described in Example 1. The substrate base was then activated using a palladium/tin catalyst. It was immersed in an acidic copper sulfate plating solution and electroplated to deposit copper metal in the cavities. After this plating operation, the substrate base was removed from the solution, rinsed in running water for 2 minutes and dried.

The substrate base was then encapsulated, wired and processed in accordance with Example 1.

EXAMPLE 3

The procedures of Example 1 were followed except that the metal alloy sheet used as the core was composed of 58% iron and 42% nickel, and it was not clad with copper metal sheets. Mechanical roughening techniques were employed in order to promote adhesion.

EXAMPLE 4

The procedures of Example 2 were followed except that the metal alloy core was replaced by a thin laminate consisting of a 0.005-inch thick fiberglass reinforced epoxy resin sheet bonded on each side with composite metal sheets. These composite metal sheets considered of 0.0045-inch thich metal alloy cores (64% iron and 36% nickel) both sides of which were clad with 0.00075-inch thick copper metal.

EXAMPLE 5

A metal alloy core of 64% iron and 36% nickel and which was 0.006 inch thick was clad on each surface with copper metal sheets having a thickness of 0.002 inch. This metal alloy core was placed onto an X-, Y-positioning table, the table was moved to predetermined locations, and 0.042-inch diameter holes were mechanically drilled through the core.

The copper surfaces of the drilled metal alloy sheet were treated to promote adhesion through the use of a commercially available black oxide treatment solution.

Several sheets of semi-cured fiberglass reinforced eopxy resin were used to fill drilled holes in the core, and a sheet of copper foil 0.0014 inch thick was laminated to one side of the drilled metal alloy core as described in Example 1.

Another sheet of copper foil 0.0014 inch thick was then laminated to the other side of the drilled metal alloy core in the same manner. After application of the copper foil to each side of the drilled metal alloy core, the resulting substrate base was baked for 60 minutes at a temperature of 350° F. to fully cure the epoxy resin.

The substrate base was then brushed in order to remove dirt, dust, oxide and similar foreign material from the surface of the copper foil. A dry film photoresist was then applied to each side of the substrate base in order to form circuit patterns on each side of the substrate base.

The substrate base was then exposed to ferric chloride solution as described in Example 1 to dissolve exposed copper metal. The remaining photoresist material was removed and the copper exposed to black oxide.

The substrate base was then encapsulated with resin and adhesive and scribed with wire, one side at a time, according to the procedures of Example 1.

The substrate base was then baked for 30 minutes at 250° F. The baking temperature was then increased to 350° F. and the substrate base baked for an additional 90 minutes.

The substrate base was then placed onto the X-, Y- positioning table described above, the table was moved to the same locations in which holes were drilled earlier, and 0.020 inch diameter holes were mechanically drilled through the layers on the substrate base.

The substrate base was then subjected to the cleaning/adhesion promotion treatment and plated in accordance with the process described in Example 1, above.

The terms and expressions which have been employed are used in terms of description and not of limitation, and there is no intention, in the use of such terms and expressions, of excluding any equivalents of the features shown and described or portions thereof, but it is recognized that various modifications are possible within the scope of the invention claims.

What is claimed is:

1. An article for providing high density electronic networks comprising:
   (a) a substrate;
   (b) a plurality of filaments having at least one conductive portion;
   (c) an encapsulating coating which maintains the positional stability of the filaments in relation to a datum, the surface of said coating being substantially smooth, flat and planar;
   (d) at least one termination point comprising a cavity at a predetermined point in registration with a filament, said conductive portion of said filament being substantially exposed and traversing said cavity, such that the position of said filament is maintained by surrounding material comprising the encapsulating coating; and
   (e) interfacing means at said predetermined points in contact with and substantially surrounding said filament, thereby interfacing the conductive portion of said filament with the external surface of said encapsulating coating.

2. An article, as recited in claim 1, wherein said filament is an insulated conductor.

3. An article, as recited in claim 1, wherein said filament is an insulated metal wire.

4. An article, as recited in claim 3, wherein said insulated metal wire is an insulated copper wire.

5. An article, as recited in claim 1, wherein said interfacing means is a conductive material.

6. An article, as recited in claim 5, wherein said conductive material is plated.

7. An article, as recited in claim 5, wherein said conductive material is electrolessly plated and then electroplated.

8. An article, as recited in claim 5, wherein said conductive material is electrolessly plated metal.

9. An article, as recited in claim 1, having a plurality of cavities.

10. An article, as recited in claim 1, wherein said substrate comprises a core which has a coefficient of thermal expansion in the plane parallel to the plane on which components are to be mounted which substantially matches the coefficient of thermal expansion of said components.

11. An article, as recited in claim 10, wherein said coefficient of thermal expansion is from about 5 to about $20 \times 10^{-6}$ in/in/°C.

12. An article, as recited in claim 11, wherein said core comprises a metal alloy.

13. An article, as recited in claim 12, wherein said metal alloy comprises about 35–45% nickel and 55–65% iron.

14. An article, as recited in claim 12, wherein said core is clad with copper.

15. An article, as recited in claim 10, wherein said core comprises a fiberglass-reinforced epoxy resin sheet bonded on both planar surfaces to 35–40% nickel, 60–65% iron metal alloy sheets said metal alloy sheets being clad with copper metal.

16. An article, as recited in claim 10, wherein said core comprises a polymer resin sheet.

17. An article, as recited in claim 16, wherein said polymer resin sheet comprises a polyimide.

18. An article, as recited in claim 16, wherein said polymer resin sheet comprises an epoxy.

19. An article, as recited in claim 1, wherein said substrate comprises a core clad with conductive material, a circuit pattern, a laminate sheet comprising a non-conductive layer and a conductive layer wherein said conductive layer is external to the article, a circuit pattern formed on said external conductive layer, and at least one cavity formed in the non-conductive layer which is exposed after the formation of said circuit pattern, said pattern being plated.

20. An article, as recited in claim 1, having filaments, an encapsulation layer and cavities on both planar surfaces of the substrate.

21. An article for providing high density networks comprising a substrate, a plurality of filaments, said filaments having at least one conductive portion, which have been applied and affixed to said substrate, a substantially smooth, flat, planar encapsulation layer which maintains the positional relationship of the filaments, at least one cavity at a predetermined point in registration with a filament, said conductive portion of said filament being substantially exposed, at least one hole intersecting a filament and extending through said substrate, means for interfacing said cavity and filament with the surface of the encapsulating layer and means for interfacing said hole and intersected filament with the surface of the encapsulation layer.

22. An article, as recited in claim 21, wherein said interfacing means are provided by metallized holes.

* * * * *